(12) United States Patent
Ichikawa

(10) Patent No.: US 10,727,448 B2
(45) Date of Patent: Jul. 28, 2020

(54) ORGANIC ELECTRO-LUMINESCENCE DEVICE, AND METHOD OF MANUFACTURING ORGANIC ELECTRO-LUMINESCENCE DEVICE

(71) Applicant: Sony Corporation, Tokyo (JP)

(72) Inventor: Tomoyoshi Ichikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 47 days.

(21) Appl. No.: 16/077,178

(22) PCT Filed: Jan. 20, 2017

(86) PCT No.: PCT/JP2017/001896
§ 371 (c)(1),
(2) Date: Aug. 10, 2018

(87) PCT Pub. No.: WO2017/149985
PCT Pub. Date: Sep. 8, 2017

(65) Prior Publication Data
US 2019/0067646 A1 Feb. 28, 2019

(30) Foreign Application Priority Data
Mar. 4, 2016 (JP) .................................. 2016-042181

(51) Int. Cl.
*H01L 51/00* (2006.01)
*H01L 51/52* (2006.01)
(Continued)

(52) U.S. Cl.
CPC ...... *H01L 51/5275* (2013.01); *H01L 51/0008* (2013.01); *H01L 51/50* (2013.01);
(Continued)

(58) Field of Classification Search
CPC . H01L 51/5275; H01L 51/0008; H01L 51/50; H01L 51/56; H05B 33/10; H05B 33/12; H05B 33/14
See application file for complete search history.

(56) References Cited

U.S. PATENT DOCUMENTS

| | | | |
|---|---|---|---|
| 8,981,352 B2 * | 3/2015 | Yamada | H01L 27/14625 257/40 |
| 2005/0023969 A1 * | 2/2005 | Omata | H01L 27/3246 313/504 |
| 2010/0231122 A1 * | 9/2010 | Ishida | H01L 51/5203 313/504 |

FOREIGN PATENT DOCUMENTS

| JP | 10-330920 A | 12/1998 |
|---|---|---|
| JP | 2000-138095 A | 5/2000 |

(Continued)

*Primary Examiner* — Victor A Mandala
*Assistant Examiner* — Colleen E Snow
(74) *Attorney, Agent, or Firm* — Michael Best & Friedrich LLP

(57) ABSTRACT

[Object] To provide an organic electro-luminescence device in which occurrence of failures such as local abnormal light emission and current leakage is suppressed.
[Solution] An organic electro-luminescence device including: a recessed structure in which a first electrode is provided at a bottom part and a first member serves as a sidewall; a second electrode configured to cover an entire surface of the recessed structure; and an organic light emitting layer containing an evaporation material and sandwiched by the second electrode and the recessed structure. In the organic light emitting layer, a film thickness of a layer containing a leaky material is non-uniform at the bottom part of the recessed structure, and an entire film thickness of the organic light emitting layer is generally uniform at the bottom part of the recessed structure.

17 Claims, 13 Drawing Sheets

(51) Int. Cl.
  *H05B 33/14* (2006.01)
  *H01L 51/50* (2006.01)
  *H05B 33/12* (2006.01)
  *H05B 33/10* (2006.01)
  *H01L 51/56* (2006.01)

(52) U.S. Cl.
  CPC .............. *H01L 51/56* (2013.01); *H05B 33/10* (2013.01); *H05B 33/12* (2013.01); *H05B 33/14* (2013.01)

(56) References Cited

FOREIGN PATENT DOCUMENTS

| | | |
|---|---|---|
| JP | 2006-134624 A | 5/2006 |
| JP | 2007-314873 A | 12/2007 |
| JP | 2009-158585 A | 7/2009 |
| JP | 2012-216338 A | 11/2012 |
| JP | 2013-191533 A | 9/2013 |
| JP | 2015-156253 A | 8/2015 |
| WO | 2007/113935 A1 | 10/2007 |
| WO | 2013/111600 A1 | 8/2013 |

\* cited by examiner

ORGANIC ELECTRO-LUMINESCENCE DEVICE, AND METHOD OF MANUFACTURING ORGANIC ELECTRO-LUMINESCENCE DEVICE

TECHNICAL FIELD

The present disclosure relates to an organic electro-luminescence device and a method of manufacturing the organic electro-luminescence device.

BACKGROUND ART

In recent years, illumination apparatuses and display apparatuses in which an organic electro-luminescence device is used as a light emitting device are becoming widely available. Thus, in order to further increase luminance of illumination apparatuses and display apparatuses, a technology for efficiently extracting light from a light emitting layer in an organic electro-luminescence device is demanded.

For example. Patent Literature 1 below discloses a structure (a so-called anode reflector structure) in which an organic electro-luminescence device is formed at the bottom part of a recessed structure including a first member, and the recessed structure is filled with a second member. According to Patent Literature 1, since part of light emitted from the organic electro-luminescence device can be reflected by utilizing a difference in refractive index between the first member and the second member, light extraction efficiency can be improved.

CITATION LIST

Patent Literature

Patent Literature 1: JP 2013-191533A

DISCLOSURE OF INVENTION

Technical Problem

In the structure disclosed in Patent Literature 1 above, however, since the level difference of the recessed structure is large, it is difficult to stably evaporate an organic film of the organic electro-luminescence device at the bottom part of the recessed structure. Therefore, in the organic electro-luminescence device disclosed in Patent Literature 1, failures such as local abnormal light emission and current leakage frequently occur.

Thus, the present disclosure proposes a novel and improved organic electro-luminescence device and a method of manufacturing the organic electro-luminescence device that can suppress occurrence of failures such as local abnormal light emission and current leakage.

Solution to Problem

According to the present disclosure, there is provided an organic electro-luminescence device including: a recessed structure in which a first electrode is provided at a bottom part and a first member serves as a sidewall; a second electrode configured to cover an entire surface of the recessed structure; and an organic light emitting layer containing an evaporation material and sandwiched by the second electrode and the recessed structure. In the organic light emitting layer, a film thickness of a layer containing a leaky material is non-uniform at the bottom part of the recessed structure, and an entire film thickness of the organic light emitting layer is generally uniform at the bottom part of the recessed structure.

In addition, according to the present disclosure, there is provided a method of manufacturing an organic electro-luminescence device, including: forming a recessed structure in which a first electrode is provided at a bottom part and a first member serves as a sidewall; depositing an organic light emitting layer containing an evaporation material on the recessed structure; and forming a second electrode on the organic light emitting layer. A layer containing a leaky material in the organic light emitting layer is deposited such that a film thickness becomes non-uniform at the bottom part of the recessed structure, and a film thickness of the organic light emitting layer as a whole becomes generally uniform at the bottom part of the recessed structure.

According to the present disclosure, in an organic light emitting layer of an organic electro-luminescence device, it is possible to control a film thickness of a layer containing a leaky material such that a leakage current does not flow, and to control the film thickness of the entire organic light emitting layer such that local abnormal light emission does not occur.

Advantageous Effects of Invention

According to the present disclosure as described above, it is possible to provide an organic electro-luminescence device in which occurrence of failures such as local abnormal light emission and current leakage is suppressed.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
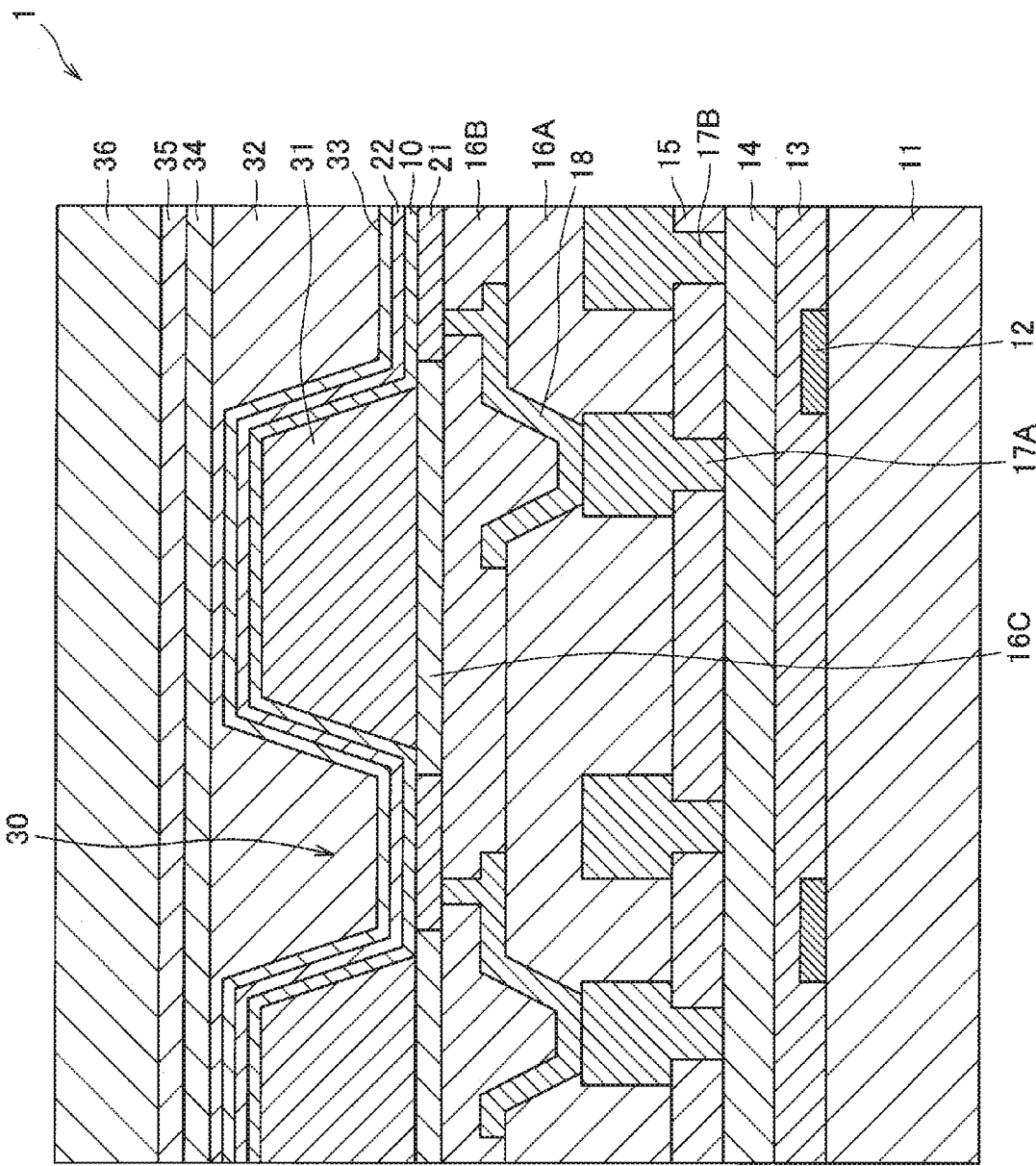
FIG. 1 is a schematic diagram showing a sectional structure of a display apparatus including an organic electro-luminescence device according to a first embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be provided in the following order.
1. First Embodiment
1.1. Structure of display apparatus
1.2. Structure of organic electro-luminescence device
1.3. Layer structure of organic electro-luminescence device
1.4. Variant
1.5. Method of manufacturing organic electro-luminescence device
2. Second Embodiment
2.1. Structure of display apparatus
2.2. Structure of organic electro-luminescence device
3. Conclusion

1. First Embodiment

[1.1. Structure of Display Apparatus]

First, a structure of a display apparatus including an organic electro-luminescence device according to a first embodiment of the present disclosure will be described with reference to FIG. 1. FIG. 1 is a schematic diagram showing a sectional structure of the display apparatus including the organic electro-luminescence device according to the present embodiment.

As shown in FIG. 1, a display apparatus 1 according to the present embodiment is a top emission system (so-called top surface light emission system) display apparatus in which an organic electro-luminescence device is used as a light emitting device. In the display apparatus 1, a plurality of organic electro-luminescence devices are located in a matrix form in a predetermined region on a driving substrate, and each of the organic electro-luminescence devices function as a pixel.

Specifically, the display apparatus 1 according to the present embodiment includes a substrate 11, a gate electrode 12, a gate insulation film 13, a semiconductor layer 14, an interlayer insulation film 15, a thin-film transistor having a drain electrode 17A and a source electrode 17B, a first electrode 21, and an organic electro-luminescence device having an organic light emitting layer 10 and a second electrode 22. In addition, the organic electro-luminescence device is protected by being covered by a protective layer 33. Note that the thin-film transistor is connected to the organic electro-luminescence device through a contact plug 18 formed inside a first planarization film 16A, a second planarization film 16B, and a third planarization film 16C.

In addition, the organic electro-luminescence device is provided inside a recessed structure 30 in which the first member 31 serves as a sidewall, and the recessed structure 30 is filled with a second member 32 having a higher refractive index than the first member 31. Since this allows the first member 31 and the second member 32 to function as light reflection parts because of a difference in refractive index, the light extraction efficiency can be improved by reflecting part of light emitted from the organic electro-luminescence device.

Further, on the second member 32, a sealing material layer 34, an optical adjustment layer 35, and an opposed substrate 36, for example, are provided in order to protect the organic electro-luminescence device or the display apparatus 1.

The substrate 11 is a supporting body of the display apparatus 1. The substrate 11 may be, for example, any type of glass substrate, a semiconductor substrate such as a silicon substrate, any type of resin substrate, or the like. In addition, the substrate 11 may be a transparent substrate, or a bendable flexible substrate. On the substrate 11, a driving circuit including the thin-film transistor that controls light emission of the organic electro-luminescence device.

The gate electrode 12 is provided in a selectable region on the substrate 11. The gate electrode 12 can contain, for example, metal such as aluminum (Al), polysilicon, or the like. Note that the gate electrode 12 is connected to a scanning circuit not shown in FIG. 1.

The gate insulation film 13 is provided over the entire surface of the substrate 11 so as to cover the gate electrode 12. The gate insulation film 13 can contain, for example, silicon oxide ($SiO_x$), silicon nitride ($SiN_x$), or the like.

The semiconductor layer 14 is provided on the gate insulation film 13. The semiconductor layer 14 can contain, for example, amorphous silicon, polycrystalline silicon, oxide semiconductor, or the like. In addition, a partial region of the semiconductor layer 14 is doped with impurities to be the p type or n type, and a drain region and a source region are formed (not shown). Further, a channel region is formed (not shown) in a region of the semiconductor layer 14 between the drain region and the source region and above the gate electrode 12. Accordingly, a bottom-gate type thin-film transistor is provided on the substrate 11. Note that the thin-film transistor has the bottom-gate type structure in FIG. 1, whilst it is needless to say that the top-gate type structure may be adopted.

The interlayer insulation film 15 is provided on the semiconductor layer 14. The interlayer insulation film 15 can contain, for example, silicon oxide ($SiO_x$), silicon nitride ($SiN_x$), silicon oxynitride (SiON), or the like. In addition, the interlayer insulation film 15 is provided with contact holes. The drain electrode 17A and the source electrode 17B can connect to the semiconductor layer 14 through the contact holes provided for the interlayer insulation film 15. Note that the drain electrode 17A and the source electrode 17B can contain, for example, metal such as aluminum (Al).

The first planarization film 16A, the second planarization film 16B, and the third planarization film 16C are provided on the driving circuit such as a thin-film transistor formed on the substrate 11, and planarize the driving circuit by covering. The first planarization film 16A, the second planarization film 16B, and the third planarization film 16C can include, for example, an organic insulation film of polyimide resin, acrylic resin, novolac resin, or the like, or an inorganic insulation film of silicon oxide ($SiO_x$), silicon nitride ($SiN_x$), silicon oxynitride (SiON), or the like.

The contact plug 18 is provided inside the first planarization film 16A, the second planarization film 16B, and the third planarization film 16C, and electrically connects the thin-film transistor and the organic electro-luminescence device. The thin-film transistor can control light emission of the organic electro-luminescence device via the contact plug 18. The contact plug 18 can contain metal such as Copper (Cu), for example.

The first electrode 21 functions as an anode of the organic electro-luminescence device, and is provided at the bottom part of the recessed structure 30 in which the first member 31 serves as the sidewall. The first electrode 21 may be formed as a light reflective electrode with metal such as aluminum (Al), aluminum alloy, platinum (Pt), gold (Au), chromium (Cr), or tungsten (W), for example. In addition, the first electrode 21 may be formed as a transparent electrode with a transparent conductive material such as indium zinc oxide. In the case where the first electrode 21 is a transparent electrode, a light reflective layer containing metal such as Al, Ag, Pt. Au, Cr, or W may be provided between the first electrode 21 and the substrate 11. The first electrode 21 has a thickness of 100 nm to 300 nm, for example.

The organic light emitting layer 10 is a layer that emits light when an electric field is applied, and a layer mainly containing an evaporative organic material. Specifically, in the organic light emitting layer 10, when an electric field is applied, a hole is injected from the first electrode 21 into the organic light emitting layer 10, and an electron is injected from the second electrode 22 into the organic light emitting layer 10. The injected hole and electron recombine within the organic light emitting layer 10 to form an exciton, and when a light emitting material is excited by the energy of the exciton, fluorescence or phosphorescence occurs.

In addition, the organic light emitting layer 10 includes a plurality of layers for each function. The organic electroluminescence device according to the present embodiment has a characteristic in the film thickness distribution of a specific layer of the organic light emitting layer 10. A detailed structure of the organic light emitting layer 10 will be described later.

The second electrode 22 functions as a cathode of the organic electro-luminescence device, and is provided on the organic light emitting layer 10. The second electrode 22 has optical transparency, and may be formed as a transparent electrode with a material having a small work function. The second electrode 22 may contain, for example, indium zinc oxide, magnesium (Mg), silver (Ag), or their alloy. The second electrode 22 has a thickness of 3 nm to 200 nm, for example.

In addition, the second electrode 22 may include a multi-layer film. Specifically, the second electrode 22 may be formed as a laminated film of a first layer containing calcium (Ca), barium (Ba), lithium (Li), cesium (Cs), indium (In), magnesium (Mg), or silver (Ag), and a second layer containing magnesium (Mg), silver (Ag), or their alloy.

The protective layer 33 is provided on the second electrode 22, and prevents the water content from entering the organic light emitting layer 10. The protective layer 33 may be formed at 1 µm to 8 µm with a material having high optical transparency and low permeability, for example. The protective layer 33 can contain, for example, silicon oxide ($SiO_x$), silicon nitride ($SiN_x$), aluminum oxide ($AlO_x$), titanium oxide ($TiO_x$), or their combination.

The first member 31 is provided on the third planarization film 16C, and separates the organic electro-luminescence device into respective pixels. The first member 31 is formed into a generally parallelepiped shape (that is, a tapered shape) having an inclined part, for example. Therefore, the recessed structure 30 including the first member 31 has a structure (that is, a reverse tapered shape) opened to the opposite side of the substrate 11. The first member 31 includes a low-refractive-index material having a lower refractive index than the second member 32, and can include, for example, an organic insulation film such as polyimide resin, acrylic resin, or novolac resin, an inorganic insulation film such as silicon oxide ($SiO_x$), silicon nitride ($SiN_x$), or silicon oxynitride (SiON), or the like.

The second member 32 is provided on the protective layer 33 so as to fill the recessed structure 30 including the first member 31. The second member 32 contains a high-refractive-index material having a higher refractive index than the first member 31, and can include, for example, a transparent organic insulation film such as polyimide resin, acrylic resin, or novolac resin, a transparent inorganic insulation film such as silicon oxide ($SiO_x$), silicon nitride ($Si_{1-x}N_x$), silicon oxynitride (SiON), or the like. Since this allows the first member 31 and the second member 32 to function as light reflection parts with respect to light emitted from the organic electro-luminescence device, the efficiency of extracting light from the organic electro-luminescence device can be improved.

The sealing material layer 34 is an adhesive layer that bonds the substrate 11 and the opposed substrate 36. The sealing material layer 34 may be, for example, a UV curable resin or a thermosetting resin. Specifically, the sealing material layer 34 is applied onto the second member 32 and bonded to the opposed substrate 36, then cured by ultraviolet rays or heat to bond the substrate 11 and the opposed substrate 36.

The optical adjustment layer 35 is a color filter or a black matrix provided on a surface of the opposed substrate 36. The optical adjustment layer 35 can subject light produced in the organic electro-luminescence device to color separation with a color filter and extract the light. In addition, the optical adjustment layer 35 can improve the contrast of the display apparatus 1 by absorbing unnecessary external light reflected by interconnect wires between the respective pixels or the like.

By being bonded to the substrate 11 with the sealing material layer 34, the opposed substrate 36 seals the organic electro-luminescence device to protect the organic electro-luminescence device and the display apparatus 1. The opposed substrate 36 may be, for example, a substrate having high optical transparency, such as a glass substrate and a resin substrate.

[1.2. Structure of Organic Electro-Luminescence Device]

Figure 2:
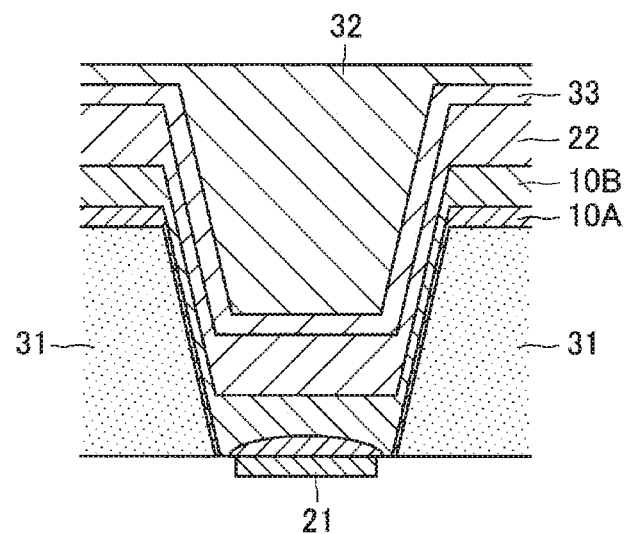
FIG. 2 is a schematic diagram showing an example of a film thickness distribution of the organic light emitting layer according to the embodiment.
Figure 3:
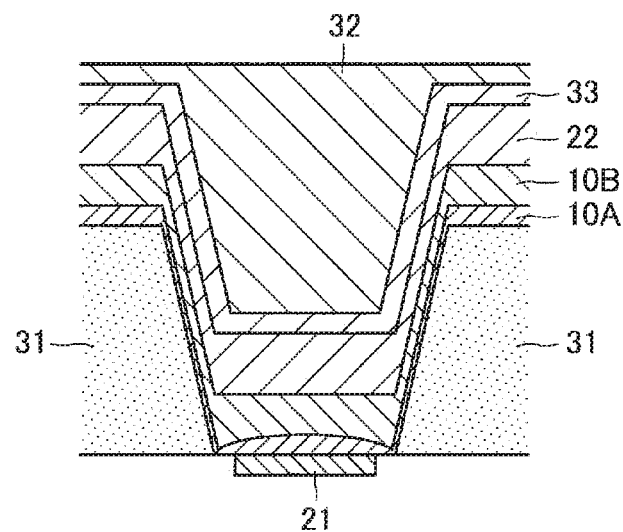
FIG. 3 is a schematic diagram showing an example of a film thickness distribution of the organic light emitting layer according to the embodiment.
Figure 4:
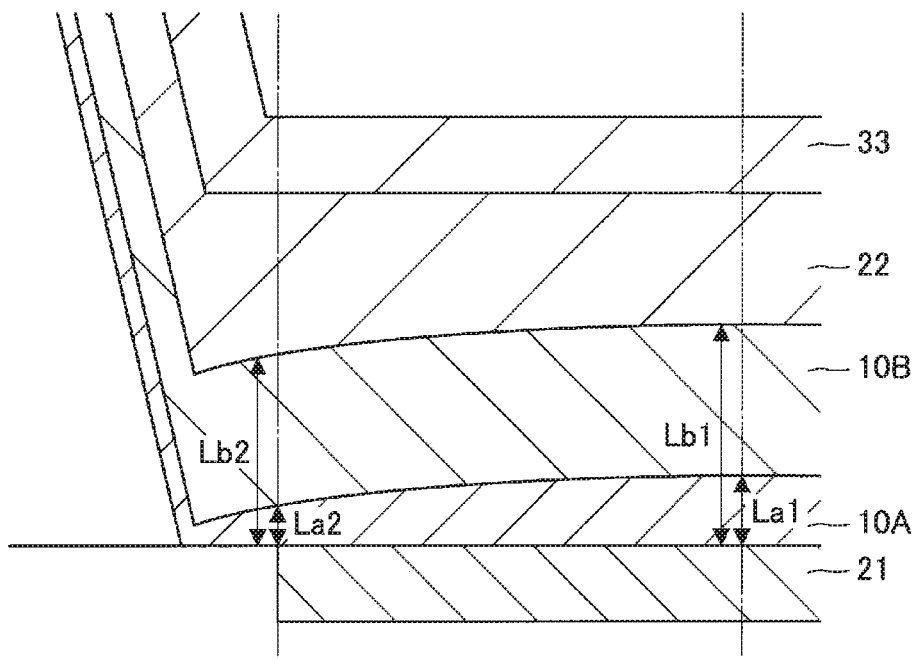
FIG. 4 is a schematic diagram enlarging the vicinity of a peripheral part of a bottom part of a recessed structure of FIG. 3.

Subsequently, a structure of the organic electro-luminescence device according to the present embodiment will be described more specifically with reference to FIG. 2 to FIG. 4. FIG. 2 and FIG. 3 are schematic diagrams enlarging the organic electro-luminescence device of FIG. 1, and showing an example of a film thickness distribution of an organic light emitting layer. FIG. 4 is a schematic diagram enlarging the vicinity of the peripheral part of the bottom part of the recessed structure 30 of FIG. 3.

In the organic electro-luminescence device according to the present embodiment, the film thickness of a layer 10A containing a leaky material in the organic light emitting layer 10 is non-uniform at the bottom part of the recessed structure 30, and the film thickness of the entire organic light emitting layer 10 is generally uniform at the bottom part of the recessed structure 30. Note that the layer 10A containing a leaky material is, for example, a hole injection layer, a hole transport layer, and the like.

Specifically, as shown in FIG. 2, the organic electro-luminescence device according to the present embodiment does not form the layer 10A containing a leaky material at the peripheral part of the bottom part of the recessed structure 30, but breaks the layer 10A containing a leaky material at the peripheral part of the bottom part of the recessed structure 30.

In the organic electro-luminescence device formed in the recessed structure 30, current leakage occurs because of asymmetry of the film thickness distribution of the organic light emitting layer 10, and the produced leakage current flows in a direction that the film thickness of the organic light emitting layer 10 is thick. Thus, in the organic electro-luminescence device according to the present embodiment, current leakage can be suppressed by making the film thickness distribution of the layer 10A containing a leaky material that greatly influences current leakage non-uniform.

For example, in the structure shown in FIG. 2, by breaking the layer 10A containing a leaky material at the peripheral part of the bottom part of the recessed structure 30, it is possible to prevent a leakage current from leaking out of the layer 10A containing a leaky material at the bottom part of the recessed structure 30 even in a situation where current leakage occurs.

On the other hand, by forming a layer 10B not containing a leaky material in the organic light emitting layer 10 such that the film thickness becomes thicker at the peripheral part of the bottom part of the recessed structure 30, the film thickness of the entire organic light emitting layer 10 is made generally uniform at the bottom part of the recessed structure 30. This is because, in the case where the film thickness of the entire organic light emitting layer 10 is non-uniform, the first electrode 21 and the second electrode 22 approach locally so that an overcurrent flows, and abnormal light emission is likely to occur. In the organic electro-luminescence device according to the present embodiment, in order to suppress current leakage, the film thickness of the layer 10A containing a leaky material is made non-uniform at the bottom part of the recessed structure 30. Thus, in the organic electro-luminescence device according to the present embodiment, the film thickness of the entire organic light emitting layer 10 is made generally uniform in order to prevent another failure such as abnormal light emission from occurring due to suppression of current leakage.

In addition, the first electrode 21 is provided at the central part of the bottom part of the recessed structure 30, and is spaced from the first member 31 which is the sidewall of the recessed structure 30. Accordingly, an electric field is not applied to the peripheral part of the bottom part of the recessed structure 30 where the layer 10A containing a leaky material is broken. The entire film thickness of the organic light emitting layer 10 is generally uniform; however, the film thickness ratio between the layer 10A containing a leaky material and the layer 10B not containing a leaky material changes at the peripheral part of the bottom part of the recessed structure 30, so that a failure such as abnormal light emission is more likely to occur than at the central part of the bottom part of the recessed structure 30. Therefore, by providing the first electrode 21 at the central part of the bottom part of the recessed structure 30 so as to be spaced from the sidewall of the recessed structure 30 to prevent an electric field from being applied, occurrence of a failure such as abnormal light emission can further be suppressed.

In addition, as shown in FIG. 3, in the organic electro-luminescence device according to the present embodiment, the layer 10A containing a leaky material may be formed such that the film thickness differs between the peripheral part and the central part of the bottom part of the recessed structure 30. More specifically, in the organic electro-luminescence device according to the present embodiment, the layer 10A containing a leaky material may be formed such that the film thickness at the peripheral part becomes thinner than the film thickness at the central part of the bottom part of the recessed structure 30.

According to the structure shown in FIG. 3, by making the film thickness of the layer 10A containing a leaky material thinner at the peripheral part of the bottom part of the recessed structure 30, leakage of a leakage current from the bottom part of the recessed structure 30 to the inclined part side can be suppressed even in a situation where current leakage occurs.

In addition, also in the structure shown in FIG. 3, by making the film thickness of the entire organic light emitting layer 10 generally uniform at the bottom part of the recessed structure 30 similarly to the structure shown in FIG. 2, occurrence of a failure such as abnormal light emission can be suppressed. Further, by providing the first electrode 21 so as to be spaced from the first member 31 which is the sidewall of the recessed structure 30, occurrence of a failure such as abnormal light emission can further be suppressed.

Further, in the structure shown in FIG. 3, the film thickness of the layer 10A containing a leaky material and the film thickness of the layer 10B not containing a leaky material may be set as indicated below.

Specifically, as shown in FIG. 4, at the bottom part of the recessed structure 30, assume that the film thickness of the layer 10A containing a leaky material at the central part is La1, the film thickness of the layer 10A containing a leaky material at the peripheral part is La2, the entire film thickness of the organic light emitting layer 10 at the central part (that is, the sum of the film thicknesses of the layer 10A containing a leaky material and the layer 10B not containing a leaky material) is Lb1, and the entire film thickness of the organic light emitting layer 10 at the peripheral part is Lb2. At this time, in the organic light emitting layer 10, the layer 10A containing a leaky material and the layer 10B not containing a leaky material may be deposited so as to satisfy the relation of (La2/La1)<(Lb2/Lb1).

This is because, even if the entire film thickness of the organic light emitting layer 10 is not uniform strictly (for example, on the order of several nanometers) at the bottom part of the recessed structure 30, the above-described effects can be expected if the change in the entire film thickness of the organic light emitting layer 10 from the central part of the bottom part of the recessed structure 30 to the peripheral part is smaller than the change in the layer 10A containing a leaky material. That is, if the non-uniformity of the entire film thickness of the organic light emitting layer 10 at the bottom part of the recessed structure 30 is smaller than the non-uniformity of the film thickness of the layer 10A containing a leaky material, it is considered that the organic electro-luminescence device according to the present embodiment is capable of suppressing current leakage and the like.

Note that the above-described film thicknesses are values obtained by measuring the film thicknesses of the layer 10A containing a leaky material and the layer 10B not containing a leaky material at a predetermined position in a direction perpendicular to the bottom part of the recessed structure. FIG. 4 shows La1 and Lb1 at different positions for convenience of illustration, whilst it is needless to say that these are film thicknesses measured at the same position. In addition, it is needless to say that La2 and Lb2 are also film thicknesses measured at the same position.

Therefore, according to the organic electro-luminescence device according to the present embodiment, it is possible to suppress occurrence of failures such as local abnormal light emission and current leakage.

Note that, in order to further suppress current leakage, it is more preferable that the layer 10A containing a leaky material is broken at the peripheral part of the bottom part of the recessed structure 30, as shown in FIG. 2. However, in order to manufacture the organic electro-luminescence device more easily, it is preferable that the film thickness of the layer 10A containing a leaky material at the peripheral part is thinner than the film thickness at the central part of the bottom part of the recessed structure 30 as shown in FIG. 3.

[1.3. Layer Structure of Organic Electro-Luminescence Device]

Figure 5:
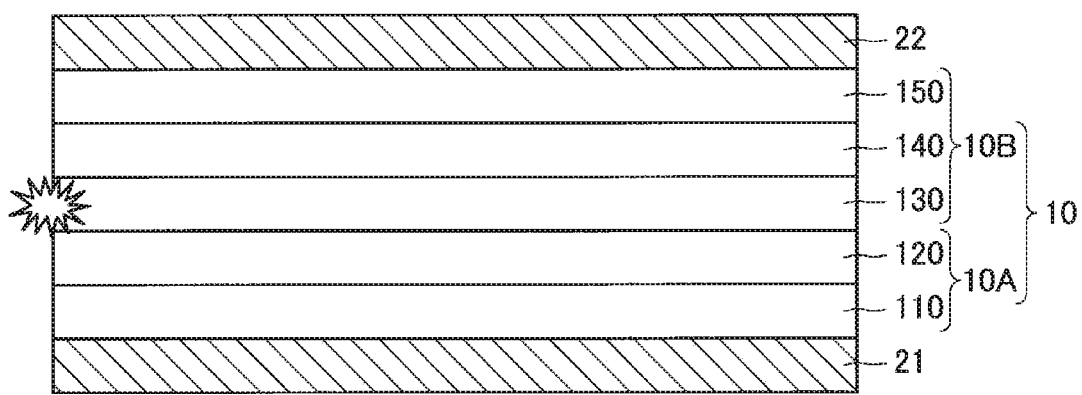
FIG. 5 is a schematic diagram showing a first layer structure of the organic electro-luminescence device according to the embodiment.
Figure 6:
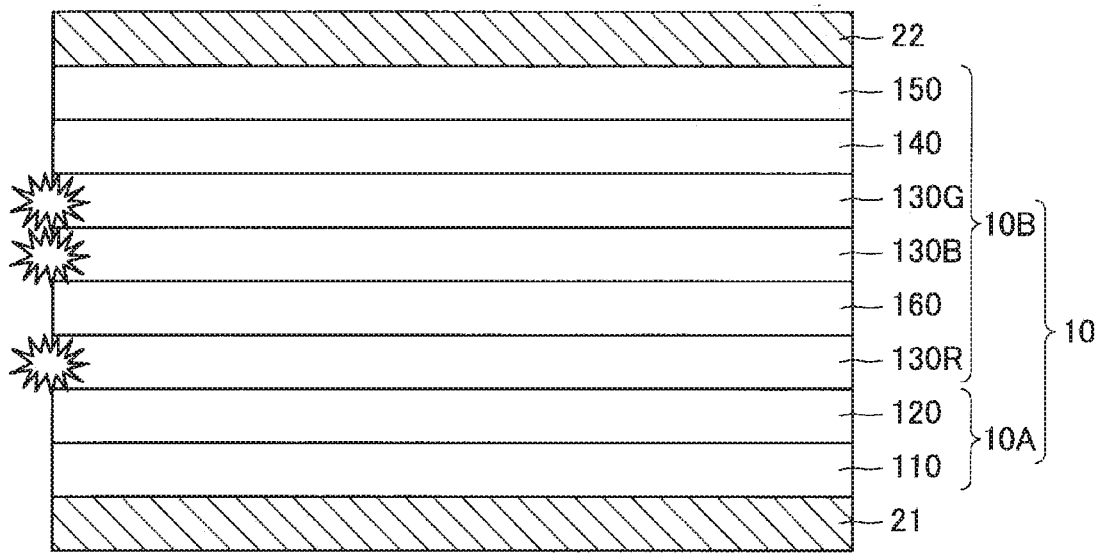
FIG. 6 is a schematic diagram showing a second layer structure of the organic electro-luminescence device according to the embodiment.

Subsequently, with reference to FIG. 5 and FIG. 6, a layer structure of the organic electro-luminescence device according to the present embodiment will be described. FIG. 5 is a schematic diagram showing a first layer structure of the organic electro-luminescence device according to the present embodiment, and FIG. 6 is a schematic diagram showing a second layer structure of the organic electro-luminescence device according to the present embodiment.

First, with reference to FIG. 5, the first layer structure of the organic electro-luminescence device according to the present embodiment will be described.

As shown in FIG. 5, the first layer structure includes the first electrode 21, a hole injection layer 110 provided on the first electrode 21, a hole transport layer 120 provided on the hole injection layer 110, a light emitting layer 130 provided on the hole transport layer 120, an electron transport layer 140 provided on the light emitting layer 130, an electron injection layer 150 provided on the electron transport layer 140, and the second electrode 22 provided on the electron injection layer 150.

In FIG. 5, the organic light emitting layer 10 represents the hole injection layer 110, the hole transport layer 120, the light emitting layer 130, the electron transport layer 140, and the electron injection layer 150. In addition, the layer 10A containing a leaky material is the hole injection layer 110 and the hole transport layer 120 (the layer 10A containing a leaky material), and the layer not containing a leaky material is the light emitting layer 130, the electron transport layer 140, and the electron injection layer 150 (the layer 10B not containing a leaky material). Note that the first electrode 21 and the second electrode 22 are as described in FIG. 1, and description here is thus omitted.

The hole injection layer 110 and the hole transport layer 120 exercise the function of increasing the efficiency of injecting holes from the first electrode 21 into the light emitting layer 130. The hole injection layer 110 is formed at an optical film thickness of 1 nm to 20 nm, for example, and the hole transport layer 120 is formed at an optical film thickness of 10 nm to 200 nm, for example.

As a compound to be used for the hole injection layer 110 and the hole transport layer 120, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, or their derivatives may be used.

Examples of a specific compound to be used for the hole injection layer 110 and the hole transport layer 120 can include α-naphthylphenyl phenylenediamine (α-NPD), porphyrin, metal tetraphenylporphyrin, metal naphthalocyanine, hexacyano azatriphenylene (HAT), 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methylphenyl)phenylamino) triphenylamine, N,N,N',N'-tetrakis(p-tolyl)p-phenylenediamine, N,N,N',N'-tetraphenyl-4,4'-diaminobiphenyl, N-phenylcarbazol, 4-di-p-tolylaminostilbene, and the like.

The light emitting layer 130 exercises the function of providing the place for hole-electron recombination and causing the light emitting material to emit light. Specifically, the light emitting layer 130 contains at least one or more of a hole transport material, an electron transport material, and a both charge transport material as a host material, and further contains a fluorescent or phosphorescent light emitting material as a dopant material. The light emitting layer 130 is formed at an optical film thickness of 5 nm to 50 nm, for example.

Examples of the host material can include styryl derivatives, anthracene derivatives, naphthacene derivatives, carbazole derivatives, aromatic amine derivatives, phenanthroline derivatives, triazole derivatives, quinolinato metal complexes, phenanthroline derivatives, and the like.

In addition, as the dopant material (light emitting material), it is possible to use a publicly-known fluorescent material and phosphorescent material. Examples of the publicly-known fluorescent material can include styrylbenzene dyes, oxazole dyes, perylene dyes, coumarin dyes, and acridine dyes, aromatic hydrocarbon materials such as anthracene derivatives, naphthacene derivatives, pentacene derivatives, and chrysene derivatives, pyrromethene skeletal compounds or metal complexes, quinacridone derivatives, cyanomethylene pyran derivatives, benzothiazole compounds, benzoimidazole compounds, metal chelated oxinoid compounds, and the like.

Examples of the publicly-known phosphorescent material can include organic metal complexes containing at least one metal selected from among ruthenium, rhodium, palladium, silver, rhenium, osmium, iridium, platinum, and gold. Examples of the publicly-known phosphorescent material can include complexes of Ir(ppy)$_3$ having a noble metal element such as Ir as a central metal and the like, complexes of Ir(bt)$_2$.acac$_3$ and the like, and complexes of PtOEt$_3$ and the like.

The electron transport layer 140 exercises the function of increasing the efficiency of injecting electrons into the light emitting layer 130. The electron transport layer 140 is formed at an optical film thickness of 10 nm to 200 nm, for example.

Examples of a compound to be used for the electron transport layer 140 can include tris(8-quinolinato)aluminum (Alq$_3$) described above, compounds having a nitrogen-containing aromatic ring, and the like. Examples of a specific compound to be used for the electron transport layer 140 can include tris(8-quinolinato)aluminum (Alq$_3$), 2,9-dimethyl-4,7-diphenyl-1,10-phenanthroline (BCP), and bathophenanthroline (Bphen).

In addition, the electron transport layer 140 may include a plurality of layers, and may include a layer doped with an alkali metal element or an alkaline earth metal element. For example, the electron transport layer 140 may include a layer obtained by doping the above-described layer containing Alq$_3$, BCP, or Bphen with an alkali metal element such as lithium (Li), sodium (Na), potassium (K), rubidium (Rb), and cesium (Cs) and an alkaline earth metal element such as magnesium (Mg), calcium (Ca), strontium (Sr), and barium (Ba) by 0.5 mass % to 15 mass % with respect to the total mass of the relevant layer.

The electron injection layer 150 exercises the function of increasing the efficiency of injecting electrons from the second electrode 22. The electron injection layer 150 is formed at an optical film thickness of 0.1 nm to 10 nm, for example.

Examples of a compound to be used for the electron injection layer 150 can include lithium fluoride (LiF), sodium chloride (NaCl), cesium fluoride (CsF), lithium oxide (Li$_2$O), barium oxide (BaO), and the like. Note that the electron injection layer 150 is any layer, and is provided according to necessity.

Next, the second layer structure of the organic electro-luminescence device according to the present embodiment will be described with reference to FIG. 6.

As shown in FIG. 6, the second layer structure includes the first electrode 21, the hole injection layer 110 provided on the first electrode 21, the hole transport layer 120 provided on the hole injection layer 110, a red light emitting layer 130R provided on the hole transport layer 120, an emission separation layer 160 provided on the red light emitting layer 130R, a blue light emitting layer 130B and a green light emitting layer 130G provided on the emission separation layer 160, the electron transport layer 140 provided on the green light emitting layer 130Q the electron injection layer 150 provided on the electron transport layer 140, and the second electrode 22 provided on the electron injection layer 150.

The second layer structure is different from the first layer structure in including the red light emitting layer 130R, the blue light emitting layer 130B, and the green light emitting layer 130G as the light emitting layers, and including the emission separation layer 160. According to the second layer structure, light of a wide wavelength from red to blue belonging to the visible light wavelength band can be emitted at the same time. Note that the other respective layers are similar to those in the first layer structure, and description here is thus omitted.

In FIG. 6, the layer 10A containing a leaky material is at least one of the hole injection layer 110 and the hole transport layer 120, and the layer 10B not containing a leaky material is the red light emitting layer 130R, the emission separation layer 160, the blue light emitting layer 130B, the green light emitting layer 130G, the electron transport layer 140, and the electron injection layer 150.

The red light emitting layer 130R contains a red light emitting material, and emits red light when a hole injected from the hole transport layer 120 and an electron injected from the emission separation layer 160 combine. Specifically, the red light emitting layer 130R contains at least one or more of a hole transport material, an electron transport material, and a both charge transport material as a host material, and further contains a fluorescent or phosphorescent red light emitting material as a dopant material. For example, the red light emitting layer 130R can be formed by doping 4,4-bis(2,2-diphenylbinin)biphenyl (DPVBi) with 2,6-bis[(4'-methoxydiphenylamino)styril]-1,5-dicyanon-aphthalene (BSN) by 30 mass % with respect to the total mass of the relevant layer.

The emission separation layer 160 exercises the function of adjusting injection of holes and electrons into the red light emitting layer 130R, the blue light emitting layer 130B, and the green light emitting layer 130G Specifically, the emission separation layer 160 contains at least one or more of a hole transport material, an electron transport material, and a both charge transport material, and by adjusting injection of holes and electrons into the light emitting layers of respective colors, can adjust the light emission balance among the respective colors. Materials contained in the emission separation layer 160 are selected on the basis of materials of the light emitting layers of respective colors and a requested light emission balance among the respective colors, and the emission separation layer 160 can be formed by appropriately using any of a publicly-known hole transport material, electron transport material, and both charge transport material.

The blue light emitting layer 130B contains a blue light emitting material, and emits blue light when a hole injected from the emission separation layer 160 and an electron injected from the green light emitting layer 130G combine. Specifically, the blue light emitting layer 130B contains at least one or more of a hole transport material, an electron transport material, and a both charge transport material as a host material, and further contains a fluorescent or phosphorescent blue light emitting material as a dopant material. For example, the blue light emitting layer 130B can be formed by doping DPVBi with 4,4'-bis[2-{4-(N,N-diphenylamino)phenyl}vinyl)biphenyl (DPAVBi) by 2.5 mass % with respect to the total mass of the relevant layer.

The green light emitting layer 130G contains a green light emitting material, and emits green light when a hole injected from the blue light emitting layer 130B and an electron injected from the electron transport layer 140 combine. Specifically, the green light emitting layer 130G contains at least one or more of a hole transport material, an electron transport material, and a both charge transport material as a host material, and further contains a fluorescent or phosphorescent green light emitting material as a dopant material. For example, the green light emitting layer 130G can be formed by doping DPVBi with coumarin 6 by 5 mass % with respect to the total mass of the relevant layer.

In the organic electro-luminescence device according to the present embodiment, the layer structure of the organic light emitting layer 10 is not particularly limited as long as the film thickness of the layer 10A containing a leaky material is non-uniform at the bottom part of the recessed structure 30, and the entire film thickness of the organic light emitting layer 10 is generally uniform at the bottom part of the recessed structure 30. The layer structure of the organic electro-luminescence device according to the present embodiment may be another layer structure other than the first and second layer structures described above.

[1.4. Variant]

Figure 7:
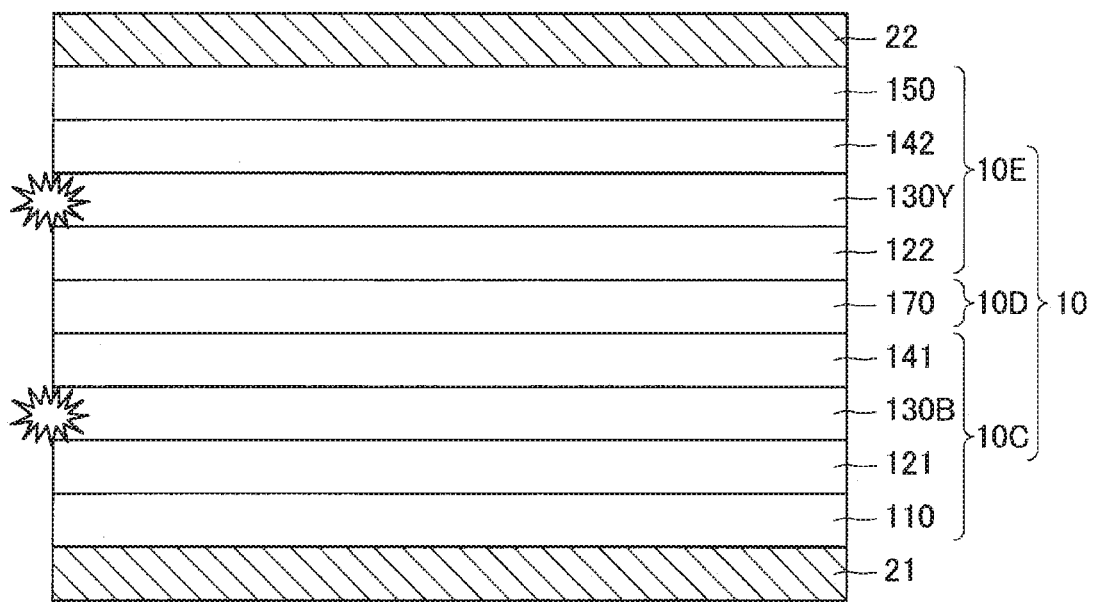
FIG. 7 is a schematic diagram showing a layer structure of an organic electro-luminescence device according to a variant of the embodiment.

Subsequently, an organic electro-luminescence device according to a variant of the present embodiment will be described with reference to FIG. 7 to FIG. 9. FIG. 7 is a schematic diagram showing a layer structure of the organic electro-luminescence device according to the present variant.

As shown in FIG. 7, the present variant is an organic electro-luminescence device having a structure (so-called tandem structure) in which a plurality of light emitting units including light emitting layers (the blue light emitting layer 130B and a yellow light emitting layer 130Y) are laminated with a charge producing layer 170 interposed therebetween.

Specifically, the organic electro-luminescence device according to the present variant includes the first electrode 21, the hole injection layer 110 provided on the first electrode 21, a first hole transport layer 121 provided on the hole injection layer 110, the blue light emitting layer 130B provided on the first hole transport layer 121, a first electron transport layer 141 provided on the blue light emitting layer 130B, the charge producing layer 170 provided on the first electron transport layer 141, a second hole transport layer 122 provided on the charge producing layer 170, the yellow light emitting layer 130Y provided on the second hole transport layer 122, a second electron transport layer 142 provided on the yellow light emitting layer 130Y, the electron injection layer 150 provided on the second electron transport layer 142, and the second electrode 22 provided on the electron injection layer 150.

In FIG. 7, the layer containing a leaky material is the charge producing layer 170 (a layer 10D containing a leaky material), and the layer not containing a leaky material is the hole injection layer 110, the first hole transport layer 121, the blue light emitting layer 130B, and the first electron transport layer 141 (the layer 10C not containing a leaky material), and the second hole transport layer 122, the yellow light emitting layer 130Y, the second electron transport layer 142, and the electron injection layer 150 (a layer 10E not containing a leaky material).

Note that the first electrode 21, the second electrode 22, the hole injection layer 110, the blue light emitting layer 130B, and the electron injection layer 150 are as described above, and description here is thus omitted. In addition, the first hole transport layer 121 and the second hole transport layer 122 are substantially similar to the hole transport layer 120, and the first electron transport layer 141 and the second electron transport layer 142 are substantially similar to the electron transport layer 140, and description here is thus omitted.

The yellow light emitting layer 130Y contains a yellow light emitting material, and emits yellow light when a hole injected from the second hole transport layer 122 and an electron injected from the second electron transport layer 142 combine. Specifically, the yellow light emitting layer 130Y contains at least one or more of a hole transport material, an electron transport material, and a both charge transport material as a host material, and further contains a fluorescent or phosphorescent yellow light emitting material as a dopant material. For example, the yellow light emitting layer 130Y can be formed by doping N,N'-dicarbazolyl-4,4'-biphenyl (CBP) with tris(benzoquinoline)iridium $(Ir(bzq)_3)$ by 5 mass % with respect to the total mass of the relevant layer.

When an electric field is applied to the organic electro-luminescence device, the charge producing layer 170 exercises the function of injecting a hole into the second hole transport layer 122 arranged on the cathode side, and injecting an electron into the first electron transport layer 141 arranged on the anode side.

Specifically, the charge producing layer 170 includes an N layer provided on the anode side and a P layer provided on the cathode side. Examples of the N layer can include alkali metals, alkaline earth metals, or rare earth metals that are electron-donating metals, or metallic compounds or organic metal complexes of these metals, or the like. Examples of the P layer can include organic compounds having an acceptor property, such as azatriphenylene derivatives such as hexacyano azatriphenylene (HAT), oxide semiconductors such as molybdenum oxide $(MoO_3)$, or the like. In addition, the P layer can also include the hole injection material used for the above-described hole injection layer 110.

Subsequently, the structure of the organic electro-luminescence device having the above-described layer structure will be specifically described with reference to FIG. 8 and FIG. 9. FIG. 8 and FIG. 9 are schematic diagrams showing an example of a film thickness distribution of the organic light emitting layer according to the present variant.

The organic electro-luminescence device according to the present variant has a tandem structure, and the layer 10D containing a leaky material is the charge producing layer 170. Therefore, the organic electro-luminescence device according to the present variant has a structure in which the layer 10D containing a leaky material is sandwiched between the layers 10C and 10E not containing a leaky material as shown in FIG. 8 and FIG. 9.

Also in the organic electro-luminescence device according to the present variant, the film thickness of the layer 10D containing a leaky material in the organic light emitting layer 10 is non-uniform at the bottom part of the recessed structure 30, and the film thickness of the entire organic light emitting layer 10 is generally uniform at the bottom part of the recessed structure 30.

Figure 8:
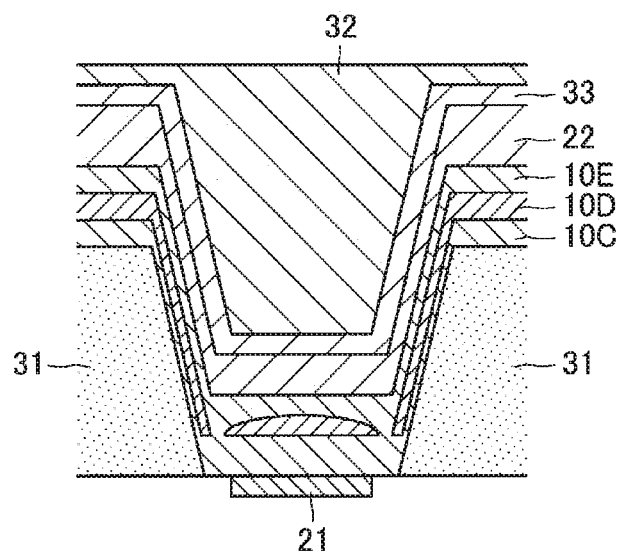
FIG. 8 is a schematic diagram showing an example of a film thickness distribution of an organic light emitting layer according to the variant.

Specifically, as shown in FIG. 8, in the organic electro-luminescence device according to the present variant, the layer 10D containing a leaky material is not formed at the peripheral part of the recessed structure 30, but is broken at the peripheral part of the recessed structure 30. Accordingly, the organic electro-luminescence device according to the present variant can suppress flowing of a leakage current.

In addition, in the organic electro-luminescence device according to the present variant, by forming at least one of the layers 10C, 10E not containing a leaky material in the organic light emitting layer 10 such that the film thickness becomes thicker at the peripheral part of the recessed structure 30, the film thickness of the entire organic light emitting layer 10 is made generally uniform at the recessed structure 30. Accordingly, since the distance between the first electrode 21 and the second electrode 22 can be made constant, the organic electro-luminescence device according to the present variant can suppress occurrence of a failure such as abnormal light emission.

Figure 9:
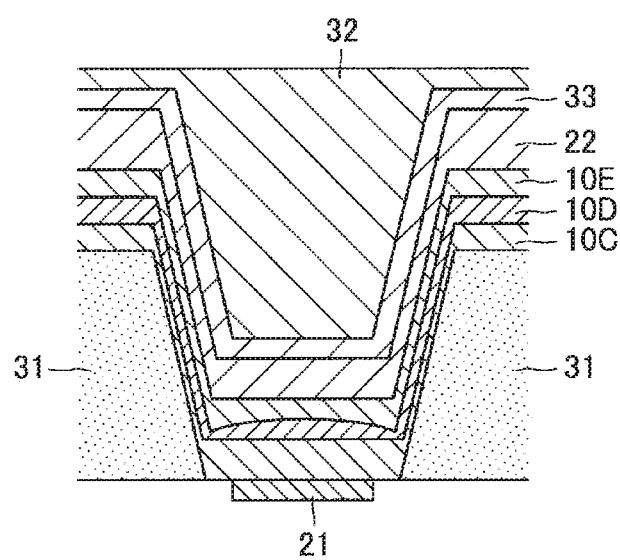
FIG. 9 is a schematic diagram showing an example of a film thickness distribution of an organic light emitting layer according to the variant.

In addition, as shown in FIG. 9, in the organic electro-luminescence device according to the present variant, the layer 10D containing a leaky material may be formed such that the film thickness differs between the peripheral part and the central part of the recessed structure 30. More specifically, in the organic electro-luminescence device according to the present variant, the layer 10D containing a leaky material may be formed such that the film thickness becomes thinner at the peripheral part than the film thickness at the central part of the recessed structure 30. According to the structure shown in FIG. 9, by making the film thickness of the layer 10D containing a leaky material thinner at the peripheral part of the recessed structure 30, the organic electro-luminescence device according to the present variant can suppress flowing of a leakage current.

In addition, similarly in the organic electro-luminescence device according to the present variant, assume that the film thickness of the layer 10D containing a leaky material at the central part is La1, the film thickness of the layer 10D containing a leaky material at the peripheral part is La2, the entire film thickness of the organic light emitting layer 10 at the central part (that is, the sum of the film thicknesses of the layer 10D containing a leaky material and the layers 10C, 10E not containing a leaky material) is Lb1, and the entire film thickness of the organic light emitting layer 10 at the peripheral part is Lb2 as described above. At this time, the organic light emitting layer 10 may be deposited so as to satisfy the relation of (La2/La1)<(Lb2/Lb1).

According to this, even if the entire film thickness of the organic light emitting layer 10 is not uniform at the bottom part of the recessed structure 30 strictly (for example, on the order of several nanometers), the organic electro-luminescence device according to the present variant can suppress current leakage and the like.

Therefore, also in the organic electro-luminescence device according to the present variant, it is possible to similarly suppress occurrence of failures such as local abnormal light emission and current leakage.

Note that description has been made in the above-described variant assuming that the layer containing a leaky material is the charge producing layer 170, the present variant is not limited to the foregoing. For example, the layer containing a leaky material may be three layers of the hole injection layer 110 and the hole transport layer 120, and the charge producing layer 170.

[1.5. Method of Manufacturing Organic Electro-Luminescence Device]

Next, a method of manufacturing the display apparatus 1 according to the present embodiment will be described with reference to FIG. 10 to FIG. 15. The display apparatus 1 according to the present embodiment can be manufactured using the following method, for example.

First, by preparing the substrate 11 containing the above-described materials and performing a predetermined deposition and patterning process on the substrate 11, a driving circuit including a thin-film transistor is formed. Subsequently, the first planarization film 16A is formed over the entire surface of the driving circuit by a spin coating method, slit coating method, or the like. Thereafter, an opening is made in the first planarization film 16A by patterning into a predetermined shape using a photolithography method or the like, and the contact plug 18 is formed in the opening. Similarly, the second planarization film 16B and the third planarization film 16C are formed, and the contact plug 18 and the first electrode 21 are formed.

Next, on the substrate 11 on which the first electrode 21 has been formed, an inorganic insulation film of silicon oxynitride (SiON) or the like is deposited as the first member 31 by a spattering method, a chemical vapor deposition (CVD) method, or the like. Subsequently, the deposited first member 31 is patterned by a lithography method and a dry etching method to be the predetermined recessed structure 30.

Subsequently, the organic light emitting layer 10 is deposited on the first member 31 on which the recessed structure 30 has been formed by a vapor deposition method. Here, the respective layers of the organic light emitting layer 10 are deposited in a film thickness distribution as described above. A method of depositing the respective layers having the above-described film thickness distribution will be described later. Next, the second electrode 22 containing indium zinc oxide or the like is deposited on the organic light emitting layer 10 by a spattering method or the like.

In addition, after deposition of the second electrode 22, the protective layer 33 is formed by a CVD method or the like, and silicon nitride ($Si_{1-x}N_x$) having a higher refractive index than the first member 31 is deposited by a spattering method, a CVD method, or the like to fill the recessed structure 30 with the second member 32. Further, the substrate 11 and the opposed substrate 36 on which the optical adjustment layer 35 has been formed are bonded using adhesive resin to be the sealing material layer 34. Note that, in the case where the second member 32 is transparent organic resin having a higher refractive index than the first member 31, the recessed structure 30 can be filled with the second member 32 by depositing the second member 32 by a spin coating method.

Through the steps as described above, the display apparatus 1 according to the present embodiment can be manufactured.

Figure 10:
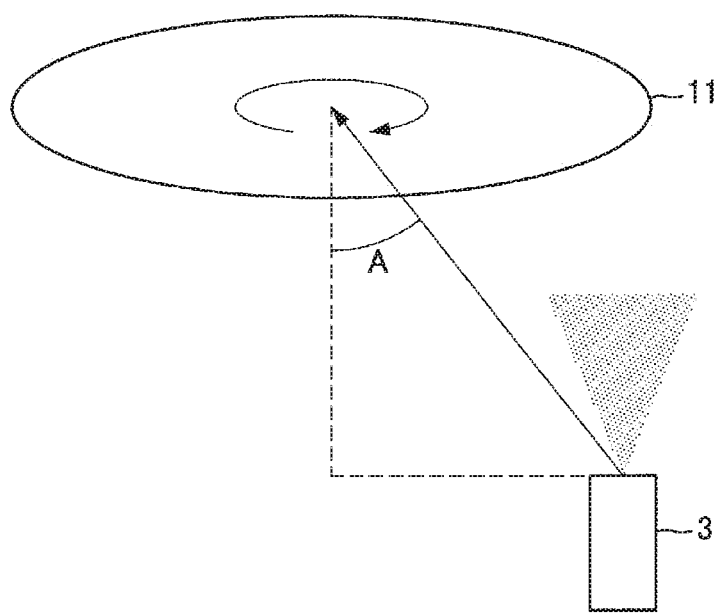
FIG. 10 is a schematic diagram illustrating a method of evaporating a layer containing a leaky material.

Here, a method of evaporating the layer 10A containing a leaky material will be described with reference to FIG. 10. FIG. 10 is a schematic diagram describing the method of evaporating the layer 10A containing a leaky material.

As shown in FIG. 10, the layer 10A containing a leaky material can be deposited such that the film thickness at the peripheral part of the recessed structure 30 is thinner than the film thickness at the central part as described above by using a rotary evaporation method.

Specifically, the substrate 11 which is an evaporation target is deposited while being rotated using a point-type evaporation source 3 with which an evaporation material spreads isotropically. At this time, the positional relationship between the point-type evaporation source 3 and the substrate 11 is set such that an angle A made by the normal of the substrate 11 and a straight line connecting the point-type evaporation source 3 and the center of the substrate 11 becomes larger than the taper angle of the recessed structure 30. Since the evaporation material is blocked by the level difference of the recessed structure 30 by performing evaporation under such a condition, the layer 10A containing a leaky material is deposited such that the film thickness at the peripheral part of the recessed structure 30 is thinner than the film thickness at the central part.

In addition, by setting the positional relationship between the point-type evaporation source 3 and the substrate 11 such that the angle A becomes larger to make the layer 10A containing a leaky material further unlikely to be evaporated at the peripheral part of the recessed structure 30, it is also possible to form a structure in which the layer 10A containing a leaky material is broken at the peripheral part of the recessed structure 30.

Figure 11:
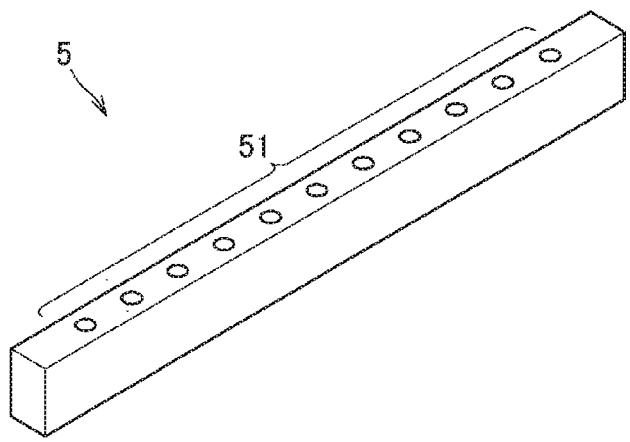
FIG. 11 is a perspective view schematically showing a line-type evaporation source for use in evaporation of a layer not containing a leaky) material.

Subsequently, a method of evaporating the layer 10B not containing a leaky material will be described with reference to FIG. 11 and FIG. 12. FIG. 11 is a perspective view schematically showing a line-type evaporation source for use in evaporation of the layer 10B not containing a leaky material, and FIG. 12 is a schematic diagram describing a method of evaporating the layer 10B not containing a leaky material.

Figure 12:
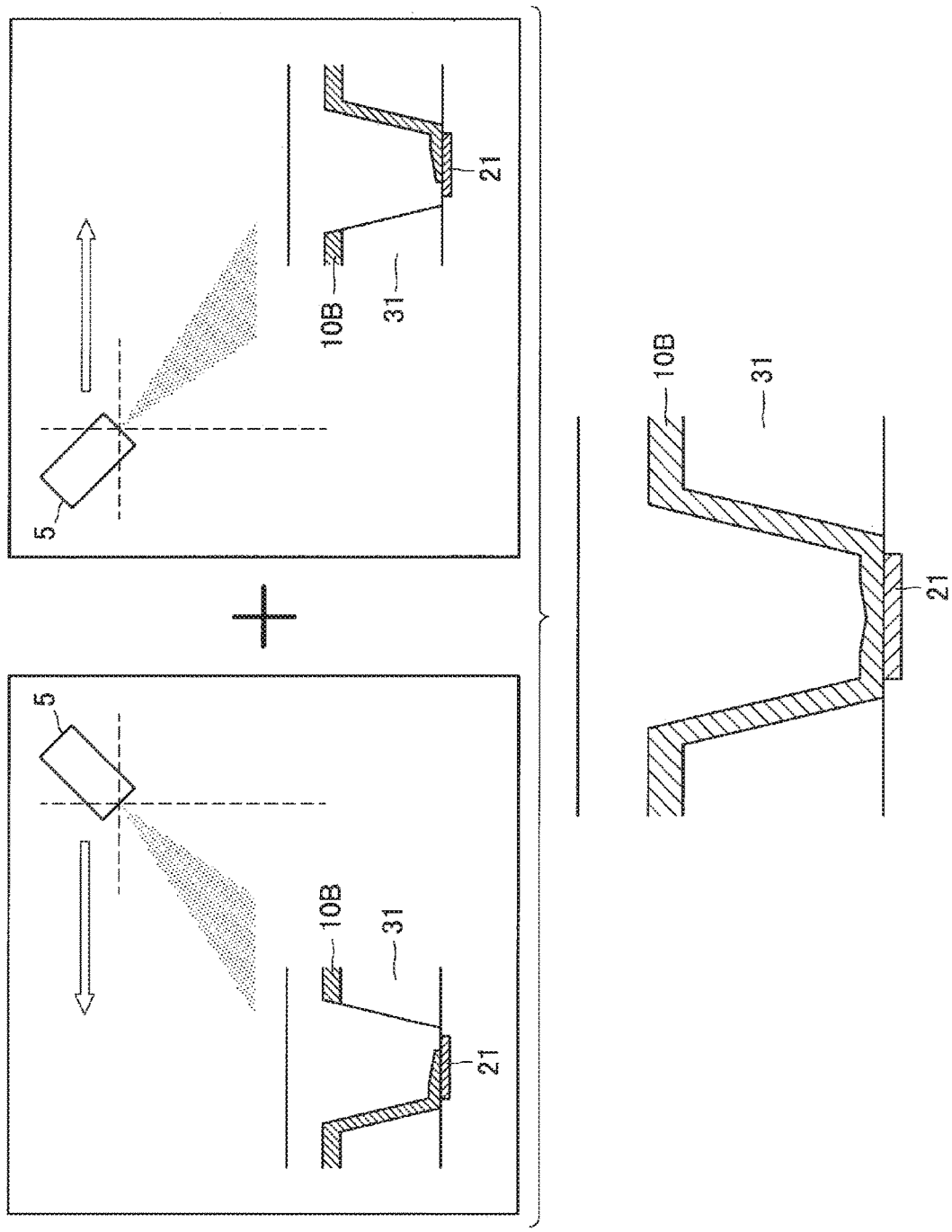
FIG. 12 is a schematic diagram describing a method of evaporating a layer not containing a leaky material.

As shown in FIG. 11 and FIG. 12, by evaporating the layer 10B not containing a leaky material while repeating reciprocation using a line-type evaporation source 5, the film thickness at the peripheral part of the recessed structure 30 can be deposited to be thicker than the film thickness at the central part as described above. Accordingly, the film thickness of the organic light emitting layer 10 in which the layer 10A containing a leaky material and the layer 10B not containing a leaky material are combined can be made generally uniform as a whole.

Specifically, the line-type evaporation source 5 has a structure in which a plurality of evaporation sources 51 are arranged in the longitudinal direction of an elongated member. By performing evaporation while reciprocating such a line-type evaporation source 5 and the substrate 11 relatively in the direction orthogonal to the longitudinal direction of the line-type evaporation source 5, the film thickness of the layer 10B not containing a leaky material to be deposited can be deposited thick at the peripheral part of the recessed structure 30.

For example, as shown in FIG. 12, in the case where the line-type evaporation source 5 is present on the right side with respect to the recessed structure 30 on the substrate 11, the layer 10B not containing a leaky material is deposited to be thicker on the first member 31 and the first electrode 21 on the left side of the recessed structure 30. On the other hand, in the case where the line-type evaporation source 5 is present on the left side with respect to the recessed structure 30 on the substrate 11, the layer 10B not containing a leaky material is deposited to be thicker on the first member 31 and the first electrode 21 on the right side of the recessed structure 30. By repeating such deposition in one direction in a reciprocating manner, the layer 10B not containing a leaky material can be deposited on the recessed structure 30 on the substrate 11 such that the film thickness at the peripheral part of the bottom part becomes thicker than at the central part.

In the case of relatively reciprocating the substrate 11 and the line-type evaporation source 5, either of the substrate 11 and the line-type evaporation source 5 may be moved. However, in order to suppress occurrence of a failure in the substrate 11 which is the evaporation target, it is more preferable to fix the substrate 11 and move the line-type evaporation source 5.

Note that, also in the case of using a coating method, it is possible to deposit the layer 10B not containing a leaky material such that the film thickness at the peripheral part becomes thicker than at the central part of the recessed structure 30. This is because, since surface tension works at the peripheral part of the recessed structure 30, the meniscus of an applied solution for deposition causes deposition to be performed such that the film thickness becomes thicker at the peripheral part than at the central part of the recessed structure 30.

Figure 13:
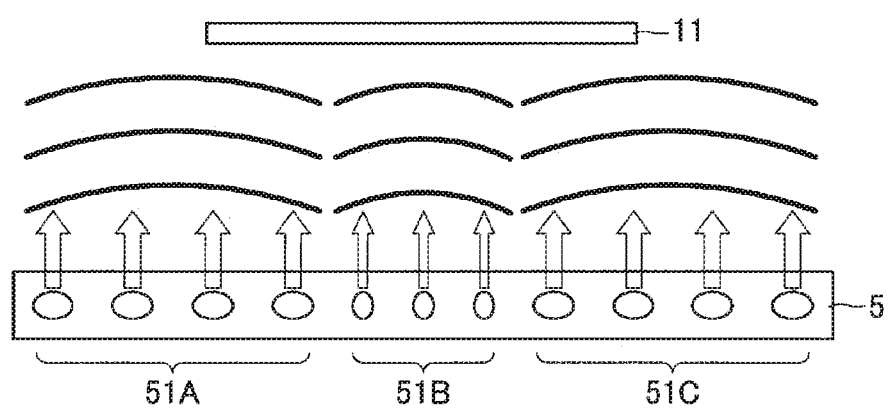
FIG. 13 is a schematic diagram illustrating an evaporation method of depositing the film thickness more uniformly using the line-type evaporation source.
Figure 14:
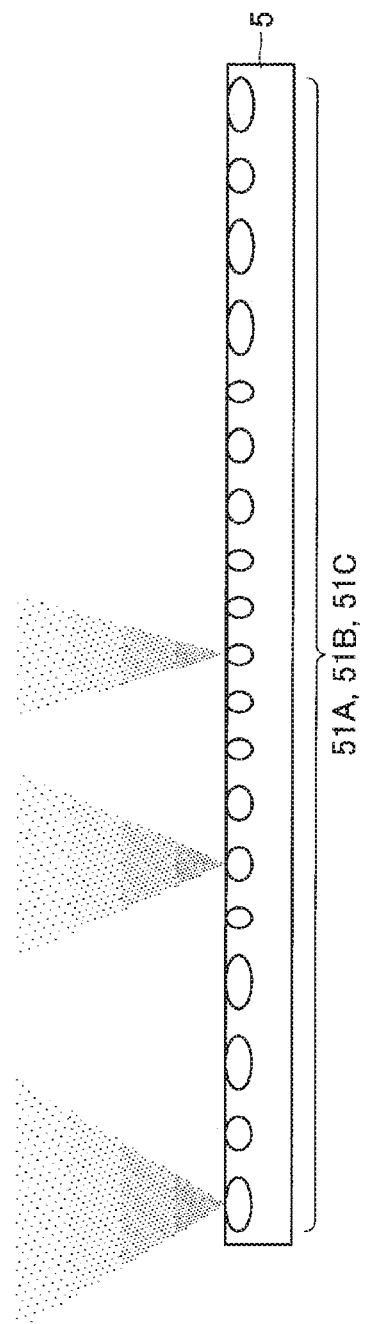
FIG. 14 is a schematic diagram illustrating an evaporation method of depositing the film thickness more uniformly using the line-type evaporation source.
Figure 15:
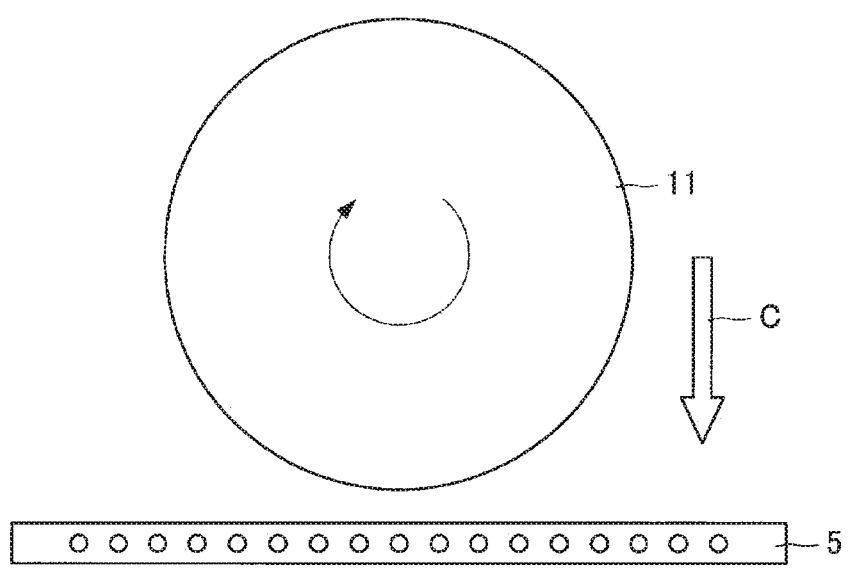
FIG. 15 is a schematic diagram illustrating an evaporation method of depositing the film thickness more uniformly using the line-type evaporation source.

Further, a deposition method of making the entire film thickness of the organic light emitting layer 10 more uniform will be described with reference to FIG. 13 to FIG. 15. FIG. 13 to FIG. 15 are schematic diagrams describing an evaporation method for performing deposition such that the film thickness becomes more uniform using the line-type evaporation source 5.

For example, in the case where, after a non-uniform film thickness distribution is formed at the bottom part of the recessed structure 30 with the layer 10A containing a leaky material, non-uniformity of the film thickness distribution is resolved by part of the layer 10B not containing a leaky material, it is preferable that the remaining part of the layer 10B not containing a leaky material is deposited such that the film thickness distribution at the bottom part of the recessed structure 30 becomes uniform. Thus, an evaporation method of depositing a film having a more uniform film thickness using the line-type evaporation source 5 will be described below.

In order to make the film thickness distribution at the bottom part of the recessed structure 30 more uniform, it is preferable to control the directivity of an evaporation source provided for the line-type evaporation source 5 with respect to the substrate 11.

For example, as shown in FIG. 13, by decreasing on average the directivity of the evaporation sources 51A, 51C at the ends of the line-type evaporation source 5 in the longitudinal direction with respect to the substrate 11, and increasing on average the directivity of the evaporation source 51B at the central part with respect to the substrate 11, the film thickness distribution of a film deposited on the substrate 11 can be made more uniform.

In the case where the directivity of evaporation with respect to the substrate 11 is high, the proportion of an evaporation material that enters the substrate 11 from the direction orthogonal to the substrate 11 increases. In such a case, the film thickness of a film deposited in the vicinity of the sidewall of the recessed structure 30 is likely to be thin. Thus, in order to increase an evaporation material that enters the substrate 11 from an oblique direction other than the direction orthogonal to the substrate 11, an evaporation source whose directivity with respect to the substrate 11 is low is used. In addition, by arranging a larger number of evaporation sources whose directivity with respect to the substrate 11 is low at the ends of the line-type evaporation source 5 in the longitudinal direction, the proportion that the evaporation material that enters the substrate 11 from an oblique direction contributes to deposition can be made larger.

In addition, the average evaporation amount of the evaporation source 51B at the central part of the line-type evaporation source 5 in the longitudinal direction may be smaller than that of the evaporation sources 51A. 51C at the ends. According to this, since the proportion that the evaporation material having low directivity with respect to the substrate 11 and entering the substrate 11 from an oblique direction contributes to deposition can be made larger, the film thickness distribution of the film deposited on the substrate 11 can be made more uniform.

In addition, as shown in FIG. 14, the arrangement of the evaporation sources 51A, 51B, 51C of the line-type evaporation source 5 in the longitudinal direction may be arranged such that, in more detail, regularity does not occur in the level of directivity of the evaporation sources 51A. 51B, 51C. Accordingly, the line-type evaporation source 5 can make the film thickness distribution of the film deposited on the substrate 11 more uniform. However, on average, it is preferable that the directivity of the evaporation sources 51A, 51C at the ends of the line-type evaporation source 5 in the longitudinal direction with respect to the substrate 11 is lower, and it is preferable that the directivity of the evaporation source 51B at the central part with respect to the substrate 11 is high, as shown in FIG. 13.

That is, by arranging the evaporation sources 51A, 51B. 51C of the line-type evaporation source 5 in the longitudinal direction at random such that regularity does not occur in the level of directivity, it is possible to increase the diversity of an incident direction component of the evaporation material that enters the substrate 11. In addition, by preventing regularity from occurring in the arrangement of the evaporation sources 51A, 51B, 51C, occurrence of a periodic pattern in the film deposited on the substrate 11 can be suppressed.

Further, as shown in FIG. 15, by performing deposition while controlling the positional relationship between the line-type evaporation source 5 and the substrate 11, the film deposited on the substrate 11 can be made further uniform. Specifically, by transferring the substrate 11 which is a target of deposition in the direction orthogonal to the longitudinal direction of the line-type evaporation source 5 while being rotated, the film deposited on the substrate 11 can be made further uniform. Since this deposition method enables the evaporation material to enter the substrate 11 from a larger variety of directions, the film thickness distribution of the film deposited on the substrate 11 can be made more uniform. Note that it is needless to say that deposition may be performed while moving the line-type evaporation source 5, rather than the substrate 11, in the direction orthogonal to the longitudinal direction.

By using the evaporation method as described above, the film thickness distribution of the layer 10A containing a leaky material and the entire film thickness distribution of the organic light emitting layer 10 can be controlled appropriately in the display apparatus 1 according to the present embodiment. Specifically, while making the film thickness distribution of the layer 10A containing a leaky material non-uniform at the bottom part of the recessed structure 30, the entire film thickness distribution of the organic light emitting layer 10 can be made generally uniform at the bottom part of the recessed structure 30.

2. Second Embodiment

[2.1. Structure of Display Apparatus]

Figure 16:
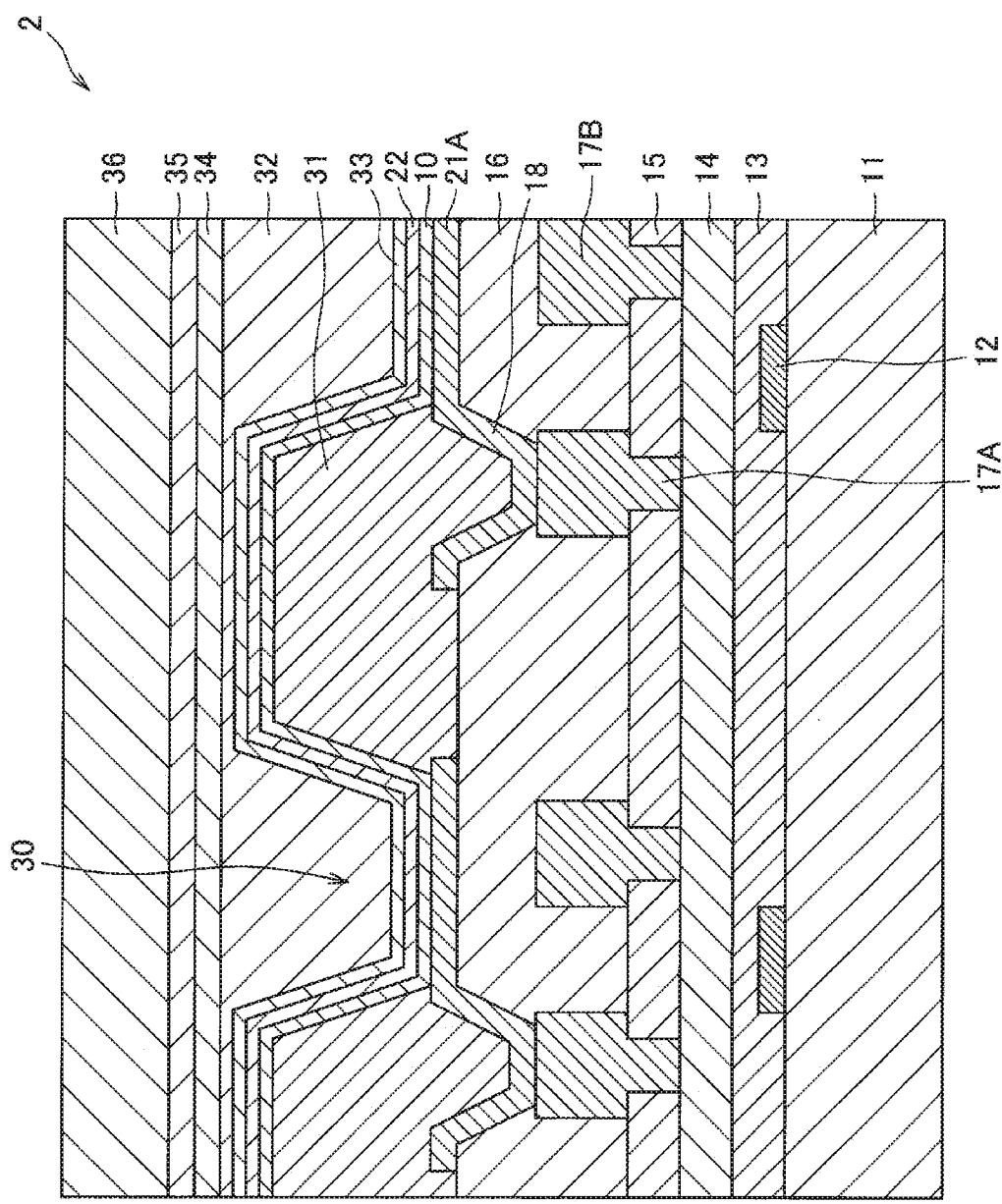
FIG. 16 is a schematic diagram showing a sectional structure of a display apparatus including an organic electro-luminescence device according to a second embodiment of the present disclosure.

Next, a structure of a display apparatus including an organic electro-luminescence device according to a second embodiment of the present disclosure will be described with reference to FIG. 16. FIG. 16 is a schematic diagram showing a sectional structure of the display apparatus including the organic electro-luminescence device according to the second embodiment.

As shown in FIG. 16, a display apparatus 2 according to the second embodiment is different from the display apparatus 1 according to the first embodiment shown in FIG. 1 in that the first electrode 21A is provided on the entire surface of the bottom part of the recessed structure 30. In addition, since the first electrode 21A and the contact plug 18 can be deposited at the same time as one metal film in the display apparatus 2 according to the second embodiment, it is possible to integrate the first planarization film 16A, the second planarization film 16B, and the third planarization film 16C as a planarization film 16. Note that, in FIG. 16, components with the identical reference characters to those in FIG. 1 are similar components to those in FIG. 1, and description here is thus omitted.

In the display apparatus 2 according to the second embodiment, the area of the first electrode 21A can be made larger than in the display apparatus 1 according to the first embodiment, and thus, the light emission area of the organic electro-luminescence device can be increased further.

However, in the display apparatus 2 according to the second embodiment, the first electrode 21A extends to the peripheral part of the recessed structure 30 to make contact with the first member 31, and thus, a failure such as local abnormal light emission is more likely to occur than in the display apparatus 1 according to the first embodiment. Therefore, in the case of giving priority to suppression of occurrence of failures such as local abnormal light emission and current leakage, it is preferable to employ the structure of the display apparatus 1 according to the first embodiment, and in the case of giving priority to enlargement of the light emission area of the organic electro-luminescence device, it is preferable to employ the structure of the display apparatus 2 according to the second embodiment.

[2.2. Structure of Organic Electro-Luminescence Device]

Subsequently, a structure of the organic electro-luminescence device according to the second embodiment will be described more specifically with reference to FIG. 17 to FIG. 20. FIG. 17 to FIG. 20 are schematic diagrams enlarging the organic electro-luminescence device of FIG. 16, and showing an example of a film thickness distribution of an organic light emitting layer.

As shown in FIG. 17 to FIG. 20, in the organic electro-luminescence device according to the second embodiment, it is possible to employ any of the structures of the organic electro-luminescence device according to the first embodiment described with reference to FIG. 2 to FIG. 9. According to this, the organic electro-luminescence device according to the second embodiment can suppress current leakage similarly to the organic electro-luminescence device according to the first embodiment.

Figure 17:
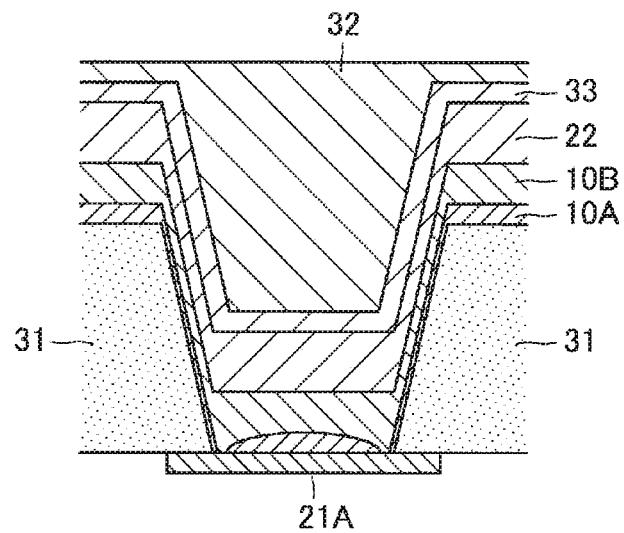
FIG. 17 is a schematic diagram showing an example of a film thickness distribution of the organic light emitting layer according to the embodiment.
Figure 18:
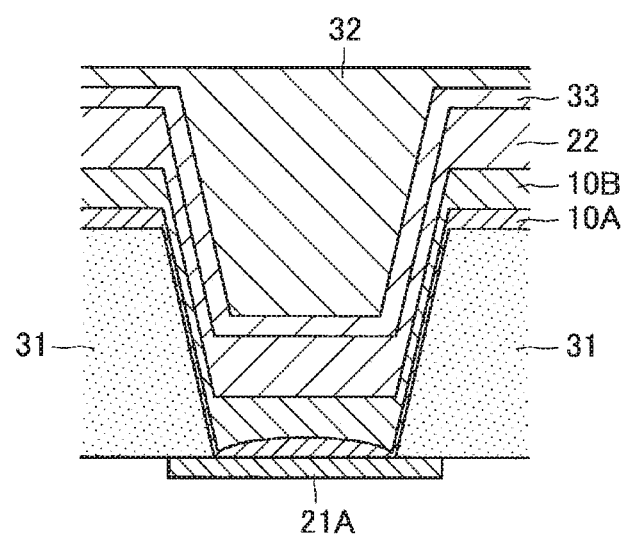
FIG. 18 is a schematic diagram showing an example of a film thickness distribution of the organic light emitting layer according to the embodiment.

For example, as shown in FIG. 17, in the organic electro-luminescence device according to the second embodiment, the layer 10A containing a leaky material may be broken at the peripheral part of the bottom part of the recessed structure 30 without forming the layer 10A containing a leaky material at the peripheral part of the bottom part of the recessed structure 30. In addition, as shown in FIG. 18, in the organic electro-luminescence device according to the second embodiment, the layer 10A containing a leaky material may be formed such that the film thickness at the peripheral part becomes thinner than the film thickness at the central part of the bottom part of the recessed structure 30. Note that, in this case, the layer 10A containing a leaky material is, for example, a hole injection layer and a hole transport layer.

Figure 19:
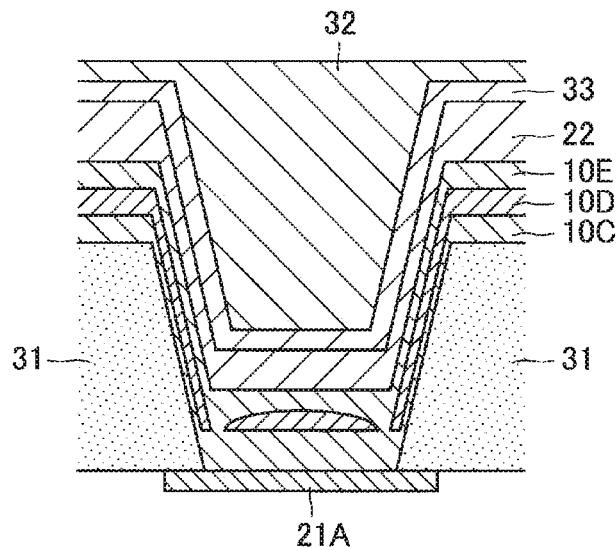
FIG. 19 is a schematic diagram showing an example of a film thickness distribution of the organic light emitting layer according to the embodiment.
Figure 20:
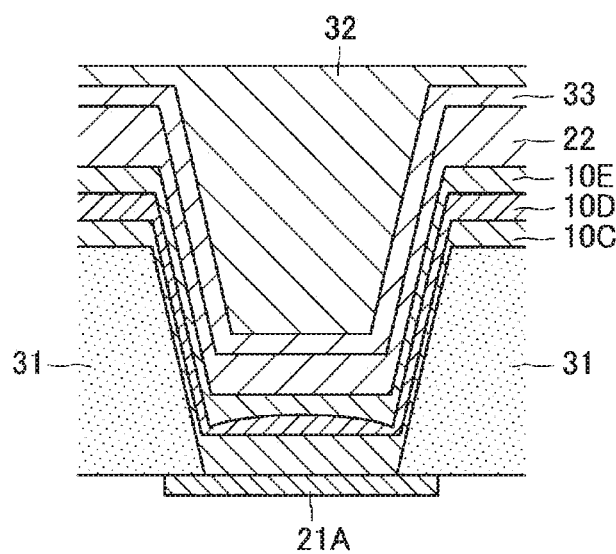
FIG. 20 is a schematic diagram showing an example of a film thickness distribution of the organic light emitting layer according to the embodiment.

In addition, the organic electro-luminescence device according to the second embodiment may be a tandem-type organic electro-luminescence device in which a plurality of light emitting layers are laminated with a charge producing layer interposed in the plurality of light emitting layers. In such a case, as shown in FIG. 19, for example, in the organic electro-luminescence device according to the second embodiment, the layer 10D containing a leaky material may be broken at the peripheral part of the recessed structure 30 without forming at the peripheral part of the recessed structure 30. In addition, as shown in FIG. 20, in the organic electro-luminescence device according to the second embodiment, the layer 10D containing a leaky material may be formed such that the film thickness at the peripheral part is thinner than the film thickness at the central part of the recessed structure 30. Note that, in this case, the layer 10D containing a leaky material is the charge producing layer, for example.

Note that, in any of the organic electro-luminescence devices shown in FIG. 17 to FIG. 20, the entire film thickness of the organic light emitting layer 10 at the bottom part of the recessed structure 30 is generally uniform. Accordingly, the organic electro-luminescence device according to the second embodiment can also suppress occurrence of local abnormal light emission.

3. Conclusion

As described above, the organic electro-luminescence devices according to the respective embodiments of the present disclosure can suppress current leakage by making the film thickness distribution of the layer containing a leaky material included in the organic light emitting layer non-uniform at the bottom part of the recessed structure. In addition, the organic electro-luminescence devices according to the respective embodiments of the present disclosure can suppress occurrence of a failure such as abnormal light emission by making the entire film thickness of the organic light emitting layer generally uniform at the bottom part of the recessed structure.

Therefore, the display apparatus according to the respective embodiments of the present disclosure can improve the efficiency of extracting light from the organic electro-luminescence device because of the anode reflector structure, while suppressing occurrence of a failure in the organic electro-luminescence device resulting from the anode reflector structure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below (1)

An organic electro-luminescence device including:

a recessed structure in which a first electrode is provided at a bottom part and a first member serves as a sidewall;

a second electrode configured to cover an entire surface of the recessed structure; and an organic light emitting layer containing an evaporation material and sandwiched by the second electrode and the recessed structure, in which in the organic light emitting layer, a film thickness of a layer containing a leaky material is non-uniform at the bottom part of the recessed structure, and an entire film thickness of the organic light emitting layer is generally uniform at the bottom part of the recessed structure.

(2)

The organic electro-luminescence device according to (1), in which the layer containing a leaky material is broken at a peripheral part of the bottom part of the recessed structure.

(3)

The organic electro-luminescence device according to (1), in which the layer containing a leaky material has different film thicknesses at a peripheral part and a central part of the bottom part of the recessed structure.

(4)

The organic electro-luminescence device according to (3), in which the film thickness of the layer containing a leaky material is thinner at the peripheral part than the film thickness at the central part of the bottom part of the recessed structure.

(5)

The organic electro-luminescence device according to (4), in which in a case of assuming that the film thickness of the layer containing a leaky material at the central part is La1, the film thickness of the layer containing a leaky material at the peripheral part is La2, and assuming that an entire film thickness of the organic light emitting layer at the central part is Lb1, and an entire film thickness of the organic light emitting layer at the peripheral part is Lb2, the organic light emitting layer satisfies a relation of (La2/La1)<(Lb2/Lb1).

(6)

The organic electro-luminescence device according to any one of (1) to (5), in which the layer containing a leaky material includes at least one of a hole injection layer and a hole transport layer.

(7)

The organic electro-luminescence device according to any one of (1) to (6), in which the organic light emitting layer includes a plurality of light emitting layers laminated with a charge producing layer interposed in the plurality of light emitting layers, and the layer containing a leaky material at least includes the charge producing layer.

(8)

The organic electro-luminescence device according to any one of (1) to (7), in which the first electrode is provided at a central part of the bottom part of the recessed structure, and is spaced from the sidewall of the recessed structure.

(9)

The organic electro-luminescence device according to any one of (1) to (7), in which the first electrode is provided on an entire surface of the bottom part of the recessed structure.

(10)

The organic electro-luminescence device according to any one of (1) to (9), further including:

a second member provided on the second electrode and filling the recessed structure, in which a refractive index of the first member included in the sidewall of the recessed structure is lower than a refractive index of the second member.

(11)

A method of manufacturing an organic electro-luminescence device, including:

forming a recessed structure in which a first electrode is provided at a bottom part and a first member serves as a sidewall;

depositing an organic light emitting layer containing an evaporation material on the recessed structure; and forming a second electrode on the organic light emitting layer, in which a layer containing a leaky material in the organic light emitting layer is deposited such that a film thickness becomes non-uniform at the bottom part of the recessed structure, and a film thickness of the organic light emitting layer as a whole becomes generally uniform at the bottom part of the recessed structure.

(12)

The method of manufacturing an organic electro-luminescence device according to (11), in which the layer containing a leaky material is deposited by rotary evaporation using a point-type evaporation source.

(13)
The method of manufacturing an organic electro-luminescence device according to (11) or (12), in which
a layer other than the layer containing a leaky material in the organic light emitting layer is deposited by a line-type evaporation source including a plurality of evaporation sources.
(14)
The method of manufacturing an organic electro-luminescence device according to (13), in which
an evaporation source group provided in a central region of the line-type evaporation source has higher averaged directivity than an evaporation source group provided in an end region.
(15)
The method of manufacturing an organic electro-luminescence device according to (13) or (14), in which
an evaporation source group provided in a central region of the line-type evaporation source has a smaller average evaporation amount than an evaporation source group provided in an end region.
(16)
The method of manufacturing an organic electro-luminescence device according to any one of (13) to (15), in which
the plurality of evaporation sources provided for the line-type evaporation source are arranged such that regularity does not occur in a level of directivity.
(17)
The method of manufacturing an organic electro-luminescence device according to any one of (13) to (16), in which
the layer other than the layer containing a leaky material in the organic light emitting layer is deposited by transporting a deposition target in a direction orthogonal to a longitudinal direction of the line-type evaporation source while rotating the deposition target.

REFERENCE SIGNS LIST 1, 2 display apparatus
10 organic light emitting layer
10A layer containing a leaky material
10B layer not containing a leaky material
11 substrate
12 gate electrode
13 gate insulation film
14 semiconductor layer
15 interlayer insulation film
17A drain electrode
17B source electrode
18 contact plug
21 first electrode
22 second electrode
30 recessed structure
31 first member
32 second member
33 protective layer
34 sealing material layer
35 optical adjustment layer
36 opposed substrate

The invention claimed is:
1. An organic electro-luminescence device comprising:
a recessed structure in which a first electrode is provided at a bottom part and a first member serves as a sidewall;
a second electrode configured to cover an entire surface of the recessed structure; and
an organic light emitting layer including a leaky material and an evaporation material, the organic light emitting layer being sandwiched by the second electrode and the recessed structure, wherein
in the organic light emitting layer, a film thickness of a layer containing the leaky material is non-uniform along the bottom part of the recessed structure, and an entire film thickness of the organic light emitting layer is generally uniform along the bottom part of the recessed structure.

2. The organic electro-luminescence device according to claim 1, wherein
the layer containing the leaky material is broken at a peripheral part of the bottom part of the recessed structure.

3. The organic electro-luminescence device according to claim 1, wherein
the layer containing the leaky material has different film thicknesses at a peripheral part and a central part of the bottom part of the recessed structure.

4. The organic electro-luminescence device according to claim 3, wherein
the film thickness of the layer containing the leaky material is thinner at the peripheral part than the film thickness at the central part of the bottom part of the recessed structure.

5. The organic electro-luminescence device according to claim 4, wherein
in a case of assuming that the film thickness of the layer containing the leaky material at the central part is $La1$, the film thickness of the layer containing the leaky material at the peripheral part is $La2$, and
assuming that an entire film thickness of the organic light emitting layer at the central part is $Lb1$, and an entire film thickness of the organic light emitting layer at the peripheral part is $Lb2$,
the organic light emitting layer satisfies a relation of $(La2/La1)<(Lb2/Lb1)$.

6. The organic electro-luminescence device according to claim 1, wherein
the layer containing the leaky material includes at least one of a hole injection layer and a hole transport layer.

7. The organic electro-luminescence device according to claim 1, wherein
the organic light emitting layer includes a plurality of light emitting layers laminated with a charge producing layer interposed in the plurality of light emitting layers, and
the layer containing the leaky material at least includes the charge producing layer.

8. The organic electro-luminescence device according to claim 1, wherein
the first electrode is provided at a central part of the bottom part of the recessed structure, and is spaced from the sidewall of the recessed structure.

9. The organic electro-luminescence device according to claim 1, wherein
the first electrode is provided on an entire surface of the bottom part of the recessed structure.

10. The organic electro-luminescence device according to claim 1, further comprising:
a second member provided on the second electrode and filling the recessed structure, wherein
a refractive index of the first member included in the sidewall of the recessed structure is lower than a refractive index of the second member.

11. A method of manufacturing an organic electro-luminescence device, comprising:
- forming a recessed structure in which a first electrode is provided at a bottom part and a first member serves as a sidewall;
- depositing an organic light emitting layer including a leaky material and an evaporation material on the recessed structure; and
- forming a second electrode on the organic light emitting layer, wherein
- a layer containing the leaky material in the organic light emitting layer is deposited such that a film thickness becomes non-uniform along the bottom part of the recessed structure, and a film thickness of the organic light emitting layer as a whole becomes generally uniform along the bottom part of the recessed structure.

12. The method of manufacturing an organic electroluminescence device according to claim 11, wherein
the layer containing the leaky material is deposited by rotary evaporation using a point-type evaporation source.

13. The method of manufacturing an organic electroluminescence device according to claim 11, wherein
a layer other than the layer containing the leaky material in the organic light emitting layer is deposited by a line-type evaporation source including a plurality of evaporation sources.

14. The method of manufacturing an organic electroluminescence device according to claim 13, wherein
an evaporation source group provided in a central region of the line-type evaporation source has higher averaged directivity than an evaporation source group provided in an end region.

15. The method of manufacturing an organic electroluminescence device according to claim 13, wherein
an evaporation source group provided in a central region of the line-type evaporation source has a smaller average evaporation amount than an evaporation source group provided in an end region.

16. The method of manufacturing an organic electroluminescence device according to claim 13, wherein
the plurality of evaporation sources provided for the line-type evaporation source are arranged such that regularity does not occur in a level of directivity.

17. The method of manufacturing an organic electroluminescence device according to claim 13, wherein
the layer other than the layer containing the leaky material in the organic light emitting layer is deposited by transporting a deposition target in a direction orthogonal to a longitudinal direction of the line-type evaporation source while rotating the deposition target.

* * * * *